United States Patent [19]

Smythe

[11] Patent Number: 4,843,326

[45] Date of Patent: Jun. 27, 1989

[54] ELECTRICAL TESTING DEVICE FOR THE POWER INPUT TO AUTOMOBILE TELEPHONE INSTALLATIONS

[76] Inventor: Robert H. Smythe, 918 Maplebrook Dr., Noblesville, Ind. 46060

[21] Appl. No.: 86,306

[22] Filed: Aug. 17, 1987

[51] Int. Cl.⁴ .......................................... G01R 31/02
[52] U.S. Cl. .................................. 324/503; 324/133;
324/508; 324/556; 379/21
[58] Field of Search .................. 324/66, 133, 503, 504,
324/508–511, 556; 340/656; 379/21; 439/912

[56] References Cited

U.S. PATENT DOCUMENTS

| | | |
|---|---|---|
| 1,696,948 | 1/1929 | Foster . |
| 2,015,209 | 9/1935 | Whiteside . |
| 2,142,355 | 1/1939 | Hastings . |
| 2,195,975 | 4/1940 | Ribble et al. .................. 324/556 X |
| 2,229,927 | 1/1941 | Kamper . |
| 2,382,647 | 8/1945 | McLoughlin et al. ............... 324/503 |
| 2,646,489 | 7/1953 | McArron . |
| 2,840,765 | 6/1958 | Carpenter . |
| 3,323,041 | 5/1967 | Warner ............................... 324/510 |
| 3,383,588 | 5/1968 | Stoll et al. . |
| 3,414,806 | 12/1968 | Carr . |
| 3,467,867 | 9/1969 | Armes et al. . |
| 3,500,293 | 3/1970 | Cocco . |
| 3,629,662 | 12/1971 | Catley . |
| 3,836,843 | 9/1974 | Yonce . |
| 3,904,958 | 9/1975 | Gartland et al. ............... 324/133 X |
| 3,922,507 | 11/1975 | White ............................. 324/133 X |
| 3,924,914 | 12/1975 | Banner . |
| 3,976,849 | 8/1976 | Champan .............................. 379/21 |
| 3,999,126 | 12/1976 | Gabor ............................... 324/556 X |
| 4,065,719 | 12/1977 | Penningroth et al. . |
| 4,090,766 | 5/1978 | Buhr et al. . |
| 4,166,242 | 8/1979 | Spiteri ................................... 324/504 |
| 4,318,578 | 3/1982 | Ericson et al. . |
| 4,415,770 | 11/1983 | Kai et al. . |
| 4,418,426 | 11/1983 | Singletary . |
| 4,513,176 | 4/1985 | Fostveit . |

Primary Examiner—Gerard R. Strecker
Attorney, Agent, or Firm—Woodard, Emhardt, Naughton Moriarty & McNett

[57] ABSTRACT

A testing device for determining, in an automobile electrical system, the integrity and continuity of the power input circuitry to a mobile telephone installation, comprises a pair of body sections that are joined to form a hollow interior region. Electrical contact pins are mounted in bores through an interior wall integral with one of the body sections. The contact pins are arranged to contact terminals, connected to the battery, ignition, and ground circuits of the automobile electrical system, at the junction between the electrical system and the telephone installation. The battery and ignition pins are connected to the input node of a red and a yellow LED, respectively. The output nodes of the LEDs are spliced together and connected to the ground pin. The LEDs are press-fit into an opening through a grommet. The grommet is press-fit and sealed onto the open end of one of the body sections. One of the body sections is adapted to mate with a standard electrical connector at the electrical system side of the junction. The red LED will be illuminated when the ground and battery circuits are properly functioning, while the yellow LED will be illuminated when the ground and ignition circuits are functioning. Neither LED will be illuminated when the ground circuit is faulty.

In another embodiment, a fourth pin is mounted in the testing device, corresponding to a terminal at the junction connected to the horn circuit of the automobile. The horn pin is connected, via a diode, to the ground pin of the testing device. The diode is biased to prevent current from flowing from the ground pin to the horn pin.

5 Claims, 1 Drawing Sheet

ELECTRICAL TESTING DEVICE FOR THE POWER INPUT TO AUTOMOBILE TELEPHONE INSTALLATIONS

BACKGROUND OF THE INVENTION

This invention relates to the testing, in an automobile electrical system, of the power input circuitry to a mobile or cellular telephone installation. More particularly, this invention provides a test device for determining the integrity and continuity of the battery, ignition, ground and horn circuits to which the telephone installation is electrically connected.

In many mobile telephone installations, the junction between the installation and the automobile electrical system is accomplished by way of a quick release multi-prong electrical connector. At the electrical system side, the connector integrates wires from the battery, ignition and ground circuits of the vehicle. A cooperative connector in the phone installation mates with the electrical system connector to provide a source of power to the installation. Some mobile telephone installations also include a link to the automobile horn circuit so that the horn sounds when a telephone call is incoming.

In testing and trouble-shooting mobile telephone installations, the first step is often to determine the conditio of the power input into the installation. When the mobile telephone installation is inoperable, the trouble source may be pinpointed to any one of the circuits to which the installation is electrically connected via the quick-release connector. The integrity of these circuits can be compromised by faulty wiring, electrical shorts, blown fuses, or wiring discontinuities.

Where the junction between the telephone installation and the automobile electrical system is accomplished by a quick release electrical connector, it is desirable to have means to test the condition and integrity of the power input at the electrical system side of the junction. Thus, a testing device that can be removably engaged to the electrical system connector is preferable. Since the junction between the telephone installation and the automobile electrical system is generally difficult to access, the testing device should be small and easily manipulated. It is also desirable that the device provide an easily discerned and interpreted indication of the integrity of the relevant electrical circuits. The present invention is addressed to these problems.

SUMMARY OF THE INVENTION

The present invention is a device for testing the input to an automobile telephone installation at the junction between the installation and terminals electrically connected to the battery, ignition and ground circuits of the automobile's electrical system. The testing device comprises a body having means for electrically contacting the terminals at the junction to indicate the condition of the battery, ignition and ground circuits. The contact means includes a first light source illuminated only when the battery and ground circuits are functioning, and a second light source illuminated only when the ignition and ground circuits are functioning. Neither the first nor second light sources is illuminated when the ground circuit is faulty.

In another embodiment of the present invention, the junction includes a terminal electrically connected to the horn circuit of the automobile, and the contact means includes a horn pin for contacting the horn circuit terminal. In this embodiment, second means are provided to connect the horn pin to the ground pin, whereby the automobile horn sounds when the contact means is contacting the terminals at the junction. A diode is included between the horn pin and the ground pin oriented to allow current to flow only from the horn pin to the ground pin.

It is an object of the present invention to provide a device for testing the power input circuitry to an automobile telephone installation that is small and easy to manipulate in the cramped environment of the junction between the telephone installation and the automobile electrical system. It is a further object to provide a testing device that is readily and removably engaged with an existing power input multi-prong connector. Another object of the present invention is to provide an obvious and easily understood indication of the status of the battery, ignition, ground, and horn circuits of the automobile electrical system that are being tapped by the mobile telephone installation. Other objects and advantages of the present invention will become apparent from the following drawings and detailed description of this invention.

DESCRIPTION OF THE PREFERRED EMBODIMENTS

Figure 1:
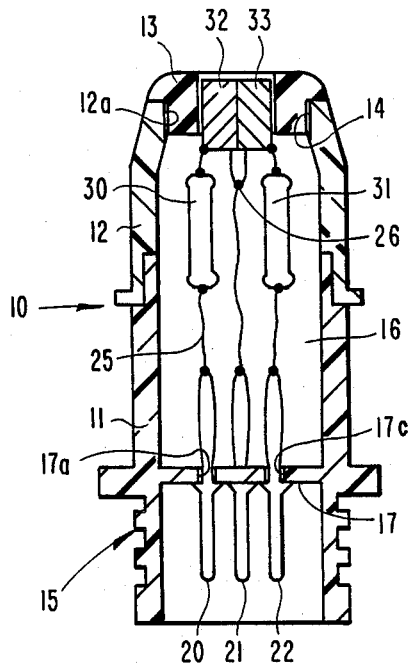
FIG. 1 is a side cross-sectional view of the testing device of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alternations and further modifications in the illustrated device, and such further applications of the principles of the invention as illustrated therein being contemplated as would normally occur to one skilled in the art to which the invention relates.

Figure 2:
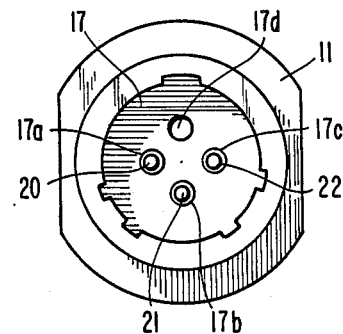
FIG. 2 is a bottom view of the testing device.

In the preferred embodiment, testing device 10 comprises a pair of hollow body sections 11 and 12 that are joined, as shown in FIG. 1, to form a hollow interior region 16. Body section 11 includes an interior wall 17 having four bores 17a–17d formed therethrough, as shown best in FIG. 2. Body segment 11 further includes molded threads 15 at one end that are adapted to mate with a standard four prong female connector commonly used at the junction between a mobile telephone installation and an automobile electrical system. As is typical in the art, the female connector forms part of the input power circuitry to the telephone installation. This connector includes terminals connected to the battery, ignition, and ground circuits in the automobile electrical system.

Three electrical contact pins 20, 21, and 22 are mounted in bores 17a, 17b, and 17c, respectively. Pins 20–22 are typical in the art for pin connectors. In the present embodiment, only three contact pins are used, leaving bore 17d open in mounting plate 17. Pins 20, 21, and 22 are appropriately situated to mate with the battery, ground and ignition terminals, respectively, of the female connector for the input power circuitry. The positions of the battery, ground, and ignition terminals in the female connector are generally common for cellular phone power inputs, although other arrangements may be accommodated by relocating the contact pins.

A pair of light sources, such as LED's 32 and 33, are mounted at one end of body portion 12, as shown in FIG. 1. LED's 32 and 33 are press-fit into bore 14 of grommet 13. Grommet 13 is similarly press-fit and sealed within opening 12a of body portion 12. LED's 32 and 33 are standard in the art, each including an input and output node. The input node of LED 32 is electrically connected to resistor 30. Resistor 30 is connected to the solder end of pin 20 by insulated wire 25. Thus, the input node of LED 32 is connected to the battery terminal of the female four prong connector. The input node of LED 33 is similarly electrically connected to resistor 31 which is wired to the solder end of pin 22 using an insulated wire 25. Thus, the input node of LED 33 corresponds to the ignition terminal of the power cable connector. The output node of each LED 32 and 33 is joined at splice 26, which is in turn connected to the solder end of pin 21 by an insulated wire 25. Since pin 21 provides a connection to the ground circuit of the automobile electrical system, a series circuit is formed between each of the battery and ignition pins and the corresponding LED's 32 and 33.

Figure 3:
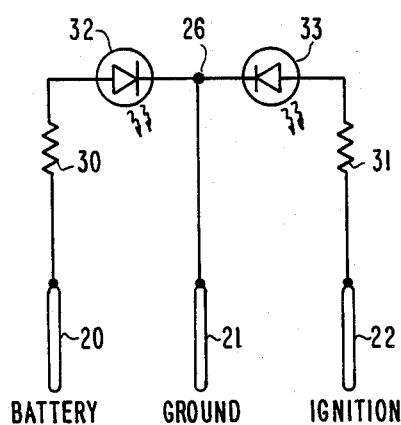
FIG. 3 is an electrical schematic diagram of the internal circuitry of the testing device of the first embodiment of the present invention.

The circuit construction of testing device 10 is shown schematically in FIG. 3. Contact pins 20, 21, and 22 are, respectively, identified with the battery, ground and ignition terminals of the female four prong connector at the junction between the telephone installation and the automobile electrical system. It is seen from the schematic in FIG. 3 that a series circuit is formed, including pin 20, resistor 30, LED 32, splice 26 and pin 21, corresponding to ground. Likewise, a series circuit is formed including pin 22, corresponding to the ignition circuit, resistor 31, LED 33, splice 26 and pin 22, corresponding to ground. In the preferred embodiment, resistors 30 and 31 have a value of 560 ohms. LED 32 is tinted red, while LED 33 is tinted yellow, in order to ensure that each LED will be visually distinct to the test operator.

Testing device 10 of the first embodiment of the present invention is used simply by uncoupling the power inlet to the cellular automobile telephone from the female four prong connector of the automobile electrical system. Testing device 10 is then engaged with the connector so that contact is made between pins 20-22 and the corresponding battery, ground, and ignition terminals of the female connector. The condition of the cellular telephone power system may be immediately determined by observing the red and yellow LED's 32 and 33, respectively. The red LED 32 is illuminated if the circuit between the battery and ground is complete. If the red LED is not illuminated, the battery circuit of the automobile electrical system is suspect, such as might occur if the battery is bad or disconnected, or if a fuse in the battery circuit is blown.

The yellow LED 33 is illuminated if the ignition circuit is complete. If the yellow LED is not illuminated, the ignition circuit of the automobile electrical system is suspect, indicating, for instance, a blown fuse in the circuit. If the ground circuit of the automobile electrical system is compromised, such as would occur if the ground circuit is "hot", neither the red nor the yellow LED will be illuminated. It is thus apparent that simply by determining which of the red and yellow LEDs is illuminated, the test operator can immediately assess the integrity of the cellular telephone power system.

Figure 4:
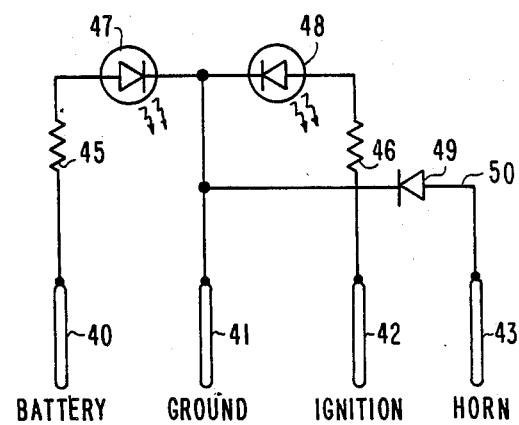
FIG. 4 is an electrical circuit diagram of the testing device of a second embodiment of the present invention.

In a second embodiment of the present invention, a separate circuit is added to test the horn circuit of the automobile electrical system. In some cellular phone installations, the automobile horn is activated when an incoming telephone call is sensed by the cellular phone system. In these installations, the female four prong connector at the junction includes a terminal connected to the horn circuit of the automobile electrical system. Testing device 10 can be modified, as in the second embodiment, to include a fourth contact pin 43. As shown in FIG. 4, contact pins 40, 41, and 42 are identical to pins 20-22 in the first embodiment. Likewise, resistors 45 and 46 and LED's 47 and 48 are identical to their counterparts in the first embodiment. Contact pin 43 can be mounted in bore 17d that was previously left open in the first embodiment. An insulated wire 50 extends from pin 43, corresponding to the horn circuit of the automobile electrical system, to pin 41, corresponding to the ground circuit. Interposed between the two pins is a standard diode 49 to prevent current from flowing from ground at pin 41 to the horn circuit at pin 43, as might occur if the ground circuit of the automobile electrical system is faulty. In this embodiment, the automobile horn circuit will be completed when the testing device is connected into the female connector. when the circuit is complete, the automobile horn will sound automatically, provided that it is not faulty. Since the status of the battery, ground, and ignition circuits of the automobile electrical system can be immediately determined by observing which, if any, of the LED's 47 and 48 are illuminated, there is no need for the horn circuit to be energized for very long.

The testing device of the present invention is composed of standard electrical components. The present testing device shown in the figures is adapted to mate with a standard four prong connector, such as AMP part no. 206060-1, which is keyed to ensure that the contact pins of the testing device mate with their proper counterpart terminals in the female connector. However, other connector fitting arrangements are acceptable that produce a positive electrical contact between the testing device and the appropriate circuits of the automobile electrical system. In the present inventionb, all components are insulated to ensure that no electrical short can occur during the use of this testing device.

The benefits of the testing device 10 of the present invention are apparent from the foregoing description. Testing device 10 is uncomplicated and simple to use to test the power cable for the cellular mobile telephone installation. The testing device is easily assembled from standard off-the-shelf electrical components and requires no complex circuitry or printed circuit board to perform its function. The red and yellow LEDs 32 and 33 provide an immediate and readily discernible indication of the status of the appropriate circuits. The testing device is small and easily connected to the existing female connector, thus making the testing device easy to use even where access to the power cable terminus is limited.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What I claim is:

1. A testing device for testing the input to an automobile telephone installation at the junction between the installation and terminals electrically connected to the battery, ignition, ground and horn circuits of the automobile's electrical system, said testing device comprising:
    a body adapted to mate with the junction;
    electrical contact means, carried by said body, for making electrical contact with the terminals at the junction when said body is mated with the junction to indicate the condition of the battery, ignition, ground and horn circuits, said contact means including;
    a first light source illuminated only when the battery and ground circuits are functioning;
    a second light source illuminated only when the ignition and ground circuits are functioning, whereby neither said first nor second light sources is illuminated when the ground circuit is faulty;
    battery, ignition, ground, and horn pins for contacting the terminals for the battery, ignition, ground and horn circuits of the automobile, respectively;
    a first resistor connected between said battery pin and a first terminal of said first light source;
    a ground wire connected between said ground pin and a second terminal of said first light source;
    a second resistor connected between said ignition pin and a first terminal of said second light source;
    a ground wire connected between said ignition pin and a second terminal of said second light source; and
    second means to connect said horn pin to said ground pin, whereby the automobile horn sounds when said contact means is contacting the terminals at the junction, said second means including a diode between said horn pin and said ground pin oriented to allow current to flow only from said horn pin to said ground pin.

2. The testing device of claim 1 wherein:
    said body defines a cavity having an opening at one end of said body;
    each of said first and second light sources includes an LED having a visually distinct color from the other; and
    said testing device further comprises;
        a grommet adapted to be pressed into said opening in said cavity, said grommet having a bore therethrough;
        wherein, each of said LED's is press-fit into said bore.

3. The testing device of claim 1, in which the junction includes a connector housing with the terminals mounted therein, and wherein:
    each of said first and second light sources includes an LED having a visually distinct color from the other;
    said testing device further comprises means for coupling said body with the connector housing for ready operable connection and disconnection, said coupling means including a flange integral with said body with said pins mounted therein and adapted for unique coupling with the connector housing so that said battery, ground, ignition and horn pins can only contact the corresponding battery, ground, ignition and horn terminals;
    said body includes;
        a first body section defining a cavity for receiving said pins, said first and second resistors and said ground wires therein; and
        a second body section, adapted to join to said first body section at a first end of said second body section to enclose said cavity, and including means for receiving each of said LEDs while said LEDs are in electrical connection with said first and second resistors and said ground wires.

4. The testing device of claim 3 wherein:
    said flange is integral with said first body section and includes a plate intersecting said cavity, said plate defining several holes adapted to receive said pins in press-fit engagement therethrough.

5. The testing device of claim 3, wherein said means for receiving each of said LEDs includes a grommet adapted to be pressed into said cavity, said grommet having a bore therethrough, wherein, each of said LED's is press-fit into said bore.

* * * * *